United States Patent [19]

Sakata et al.

[11] Patent Number: 5,233,187
[45] Date of Patent: Aug. 3, 1993

[54] MULTI-WAVELENGTH LIGHT DETECTING AND/OR EMITTING APPARATUSES HAVING SERIALLY ARRANGED GRATING DIRECTIONAL COUPLERS

[75] Inventors: Hajime Sakata, Atsugi; Shinsuke Takeuchi, Yokohama, both of Japan

[73] Assignee: Canon Kabushiki Kaisha, Tokyo, Japan

[21] Appl. No.: 978,156

[22] Filed: Nov. 17, 1992

Related U.S. Application Data

[63] Continuation of Ser. No. 823,771, Jan. 22, 1992, abandoned.

[30] Foreign Application Priority Data

Jan. 22, 1991 [JP] Japan .................................. 3-021536
Jan. 23, 1991 [JP] Japan .................................. 3-022925

[51] Int. Cl.$^5$ ............................................. H01J 40/14
[52] U.S. Cl. ............................. 250/227.24; 385/37
[58] Field of Search .............. 250/226, 227.24, 551; 385/37, 41, 14, 131, 28; 359/566, 569, 576; 357/1 H, 30 E, 30 R

[56] References Cited

U.S. PATENT DOCUMENTS

| 3,970,958 | 7/1976 | Streifer et al. | 385/28 |
| 4,860,294 | 8/1989 | Winzer et al. | 385/37 |
| 4,861,128 | 8/1989 | Ishikawa et al. | 385/131 |
| 5,131,060 | 6/1992 | Sakata | 385/37 |

FOREIGN PATENT DOCUMENTS

| 0345923 | 12/1989 | European Pat. Off. . |
| 0386797 | 9/1990 | European Pat. Off. . |
| 55-163888 | 12/1980 | Japan . |
| 58-175884 | 10/1983 | Japan . |
| 62-170907 | 7/1987 | Japan . |
| 62-229105 | 10/1987 | Japan . |
| 62-262004 | 11/1987 | Japan . |
| 2-4209 | 1/1990 | Japan . |
| 2-004209 | 1/1990 | Japan . |
| 2-056508 | 2/1990 | Japan . |
| 2-087581 | 3/1990 | Japan . |

OTHER PUBLICATIONS

"Distributed Bragg Reflection Type LD (DBR LD) Having Phase Regulating Region and Bragg Wavelength Control Region," by S. Murata et al., Electronic Letters, vol. 23, No. 8, pp. 403–406 (Apr. 1978).
"Multi-Electrode Distributed Feedback LD (DFB LD)," by Y. Kotaki et al., Electronic Letters, vol. 25, No. 15, pp. 990–992 (Jul. 1989).

Primary Examiner—David C. Nelms
Assistant Examiner—Que Ti Le
Attorney, Agent, or Firm—Fitzpatrick, Cella, Harper & Scinto

[57] ABSTRACT

In a multi-wavelength light detecting and/or emitting apparatus, there are provided of a first unit of a first directional coupler having a grating for an optical coupling function and a photodetector having a photoelectric conversion function and a second unit of a second directional coupler having a grating for an optical coupling function and a semiconductor laser, and a common light waveguide extending parallel with the unit in a light propagating direction. The first directional coupler and the photodetector are serially arranged in the light propagating direction and parallel with the common light waveguide, and the second directional coupler and the semiconductor laser are serially arranged in the light propagating direction and parallel with the common light waveguide. When there are formed a plurality of the first units and the gratings have different pitches, wavelength multiplexed light signals can be simultaneously detected per each wavelength with an equal detection performance. When there are formed a plurality of the second units and the gratings have different pitches, laser lights of different wavelengths can be emitted from a single emission end of the common waveguide and the semiconductor lasers can be independently driven.

31 Claims, 11 Drawing Sheets

MULTI-WAVELENGTH LIGHT DETECTING AND/OR EMITTING APPARATUSES HAVING SERIALLY ARRANGED GRATING DIRECTIONAL COUPLERS

This application is a continuation-in-part of Ser. No. 07/823,771, filed Jan. 22, 1992, now abandoned.

BACKGROUND OF THE INVENTION

1. Field of the Invention

The present invention relates to multi-wavelength light detecting and/or emitting apparatuses having serially arranged grating directioal couplers to be utilized in wavelength or frequency division multiplexing optical communication systems, wavelength or frequency division multiplexing optical interconnections, optical operations, recordings and measurements utilizing light in a certain wavelength range and the like. Such light detecting and/or emitting apparatuses include a multi-wavelength light emitting apparatus having a plurality of serially arranged semiconductor lasers and an integrated structure for emitting lights of different wavelengths from a common emission end surface, a demultiplexing light detecting apparatus having a plurality of serially arranged photodetector and so forth.

2. Related Background Art

In general, in optical fiber communication systems and the like, a so-called demultiplexing photodetector is important for separating and detecting wavelength-multiplexed light signals per each wavelength. A prior art demultiplexing light detecting apparatus or photodetector, such as illustrated in FIG. 1, for example, exists (see Electronics Information Communication Society Autumn Grand Meeting Informal Paper B-469 (1989)). In this apparatus, an input light 1 having a plurality of wavelength components is reflected and diffracted by a Fourier diffraction grating 2, and is again imaged by a collimating lens 3 for the separation of the wavelength components. An optical fiber array 4 is disposed at the image position of the reflection-diffracted light, and each wavelength component is detected.

This apparatus, however, has the drawback that the entire apparatus inevitably becomes large for the apparatus must spatially expand the light. Furthermore, the optical path length of the light beam 1 needs to be prolonged in order to improve the wavelength resolution and reduce an cross talk, which also leads to the apparatus of a large size.

To solve these drawbacks, such an apparatus as is disclosed in FIG. 2 has been proposed (see Japanese Patent Laid-Open No. 2-4209). In this apparatus, on a substrate 11, there are provided an n-AlGaAs first reflection layer 12, an n-AlGaAs waveguide layer 13, an n-AlGaAs second reflection layer 14, an undoped GaAs/AlGaAs superlattice light absorption layer 15, diffraction gratings 16, an n-AlGaAs third reflection layer 17, a p-AlGaAs third reflection layer 18, three electrodes 1, 2 and 3 formed on the p-AlGaAs third reflection layer 18 and a common electrode 19 formed on the bottom of the substrate 11. As shown in FIG. 2, a pin photodiode is constructed by the p-AlGaAs third reflection layer 18, the undoped GaAs/AlGaAs superlattice light absorption layer 15, the n-AlGaAs second reflection layer 14, the electrodes 1, 2 and 3, the electrode 19 and so forth, and the grating 16 is formed therein. In this structure, out of an input light of wavelengths $(\lambda_1+\lambda_2+\lambda_3+\lambda_4)$ introduced into the n-AlGaAs waveguide layer 13, components of predetermined wavelengths (in this case, from the light input side, the components of $\lambda_2$, $\lambda_3$ and $\lambda_4$ are transferred in this order by controlling respective voltages $V_1$, $V_2$ and $V_3$) are transferred into the light absorption layer 17 by the respective gratings 16 to perform a wavelength selection function. Thus, the apparatus has been made compact in size, and the integration is facilitated.

In this apparatus, however, since the selected wavelength is tuned by the control of the voltage applied to each of the electrodes 1, 2, and 3, different voltages are necessarily applied to the respective photodetectors composed of the pin structures under the electrodes 1, 2 and 3, and hence an equal voltage cannot be applied thereto. Therefore, the problem occurs that the detected current $I(\lambda_2)$, $I(\lambda_3)$ and $I(\lambda_4)$ and response speed (i.e., sensitivity speed) differ among the respective photodetectors. In general, an optimal use voltage is given according to the structure of each photodetector.

On the other hand, a multi-wavelength light emitting apparatus or semiconductor laser is also a critical device for the wavelength division multiplexing optical transmission systems, optical interconnection systems and the like. In these optical transmission and interconnection systems and the like, it is needed to multiplex and transmit output lights from the multi-wavelength light emitting apparatus or a plurality of laser lights of different wavelengths.

Conventionally, this kind of multi-wavelength light emitting apparatus or semiconductor laser is fabricated by parallelly integrating semiconductor lasers having outputs of different wavelengths and arranging a structure for combining the output light signals. For example, there has been proposed a structure in which output lights from parallelly integrated semiconductor lasers are combined by a Y-type combining device and an output of multiplexed laser lights is emitted from a single outlet, as shown in FIG. 3 (see Japanese Patent Laid-Open No. 55-163888) and in FIG. 4 (see Japanese Patent Laid-Open No. 58-175884). In FIG. 3, lights radiated from distributed Bragg reflection (DBR) type semiconductor lasers $21a \sim 21d$ provided with gratings $22a \sim 22d$ are guided into a common light waveguide 23 after they propagate through respective light waveguides $24a \sim 24d$. The thus combined light is emitted from a single outlet. In FIG. 4, lights oscillated by plural lasers 31 (wavelengths $\lambda_1 \sim \lambda_{10}$) are guided into a common light waveguide 32 after they propagate through respective light waveguides, and the thus combined light is emitted from a single outlet.

Furthermore, in another prior art apparatus illustrated in FIG. 5 (see Japanese Patent Laid-Open No. 62-229105), respective light waveguides $41a \sim 41d$ are extended from respective light emission end surfaces 42 of plural semiconductor lasers 43 to wavelength selection type directional couplers 44 provided with respective gratings or periodic structures 45. The radiated lights are thus guided into a common light waveguide 46. Antireflection coats are formed on the respective light emission end surfaces 42, and no antireflection coats are formed on the other light emission end surfaces 48. The light waveguides $41a \sim 41d$ are formed on a light waveguide substrate 49. There are further provided a light output fiber 50, and a high-reflection surface 51 is formed on the end surface of the fiber 50.

In such structures in which the semiconductor lasers are parallelly integrated and the combining portion for the output light is constructed by the curved light waveguides, however, the problem occurs that the size of the entire multi-wavelength semiconductor laser becomes extremely large. For example, assuming that the distance between the parallel semiconductor lasers is 100 μm, at least 1 mm is needed in a lateral direction (direction of parallel arrangement) when ten lasers are integrated. And a coupler length of 30 mm is needed to combine two output lights which are remote from each other by a maximum of 1 mm, when a combining angle is assumed to be 2 degrees.

Thus, only a multi-wavelength semiconductor laser of a quite large size could be obtained according to the prior art structure. Furthermore, in the prior art combining device/multiplexing device, since the propagation length is long, magnitudes of the propagation loss and radiation loss at the curved portion are not negligible and the output light intensity of the laser light is reduced.

SUMMARY OF THE INVENTION

An object of the present invention is to provide multi-wavelength light detecting and/or emitting apparatuses having serially arranged grating directional couplers which are small in size and have a good performance.

Another object of the present invention is to provide a demultiplexing light detecting apparatus having a small size, an integrated structure and a good performance.

Still another object of the present invention is to provide a multi-wavelength light emitting apparatus which is small in size, has an integrated structure and is capable of emitting plural laser lights from a common emission end.

According to one aspect of a multi-wavelength light detecting and/or emitting apparatus of the present invention, there are provided at least a unit of a directional coupler having a grating for an optical coupling function and a photodetector having a photoelectric conversion function, and a common light waveguide extending parallel with the unit in a light propagating direction. The directional coupler and the photodetector are serially arranged in the light propagating direction.

According to another aspect of a multi-wavelength light detecting and/or emitting apparatus of the present invention, there are provided at least a unit of a directional coupler having a grating for an optical coupling function and a semiconductor laser (DFB, DBR, Fabry-Perot, or other type), and a common light waveguide extending parallel with the unit in a light propagating direction. The directional coupler and the semiconductor laser are serially arranged in the light propagating direction.

These advantages and others will be more readily understood in connection with the following detailed description of the preferred embodiment in conjunction with the drawings.

DESCRIPTION OF THE PREFERRED EMBODIMENT

Figure 1:
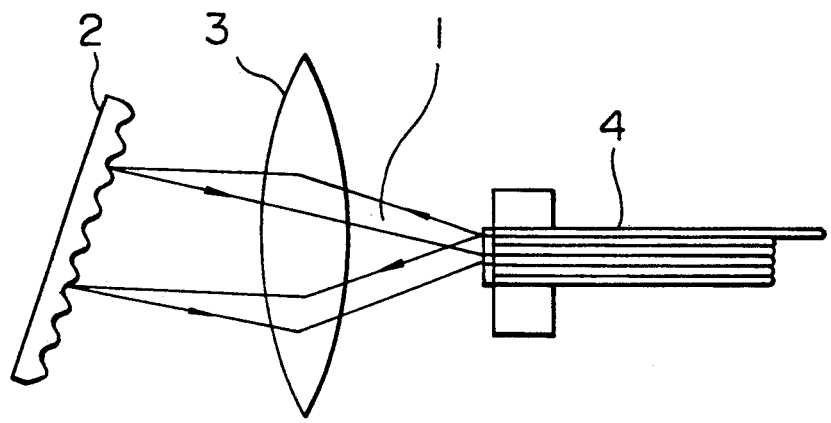
FIG. 1 is a schematic view showing a first prior art example of a demultiplexing photodetector.
Figure 2:
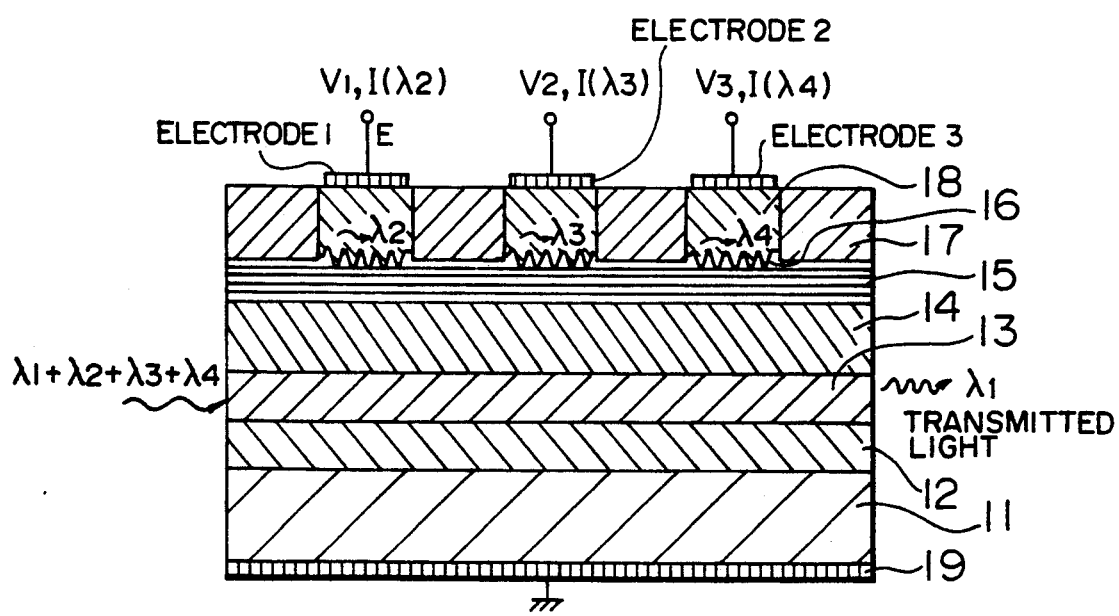
FIG. 2 is a sectional view showing a second prior art example of a demultiplexing photodetector.
Figure 3:
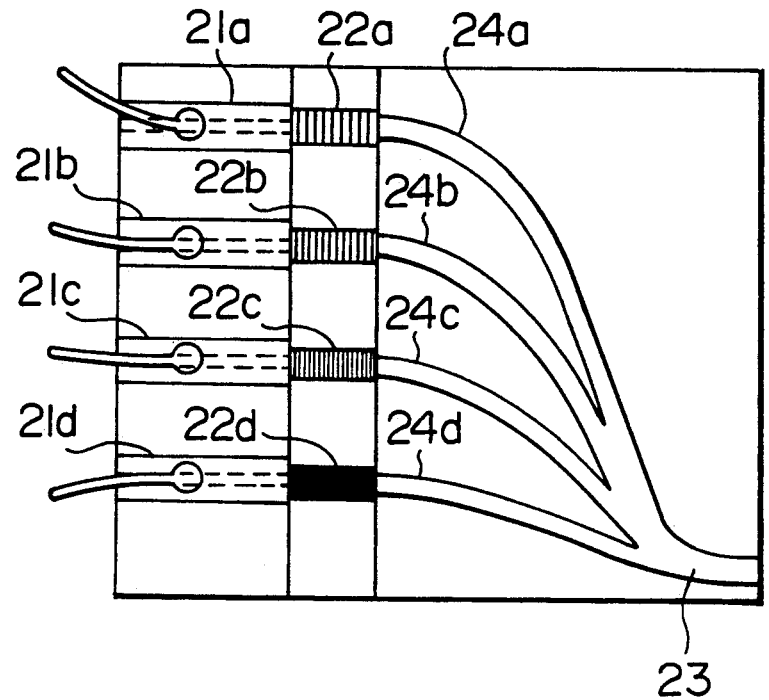
FIG. 3 is a schematic view showing a first prior art example of a multi-wavelength semiconductor laser.
Figure 4:
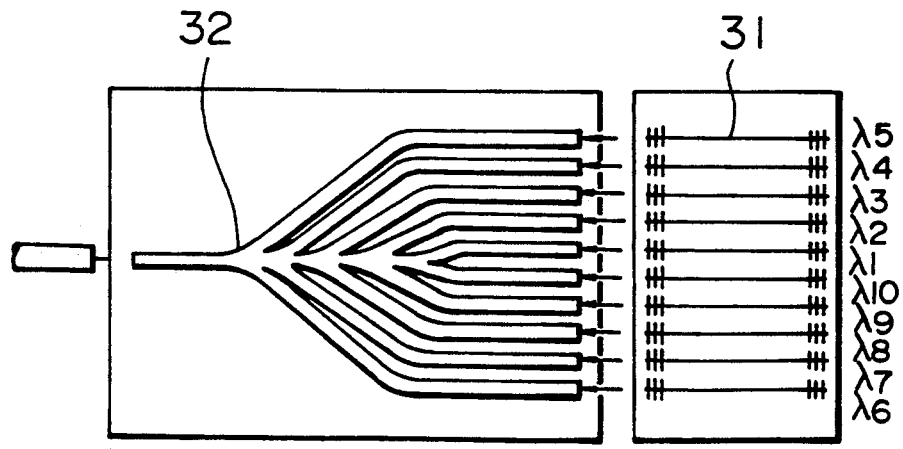
FIG. 4 is a schematic view showing a second prior art example of a multi-wavelength semiconductor laser.
Figure 5:
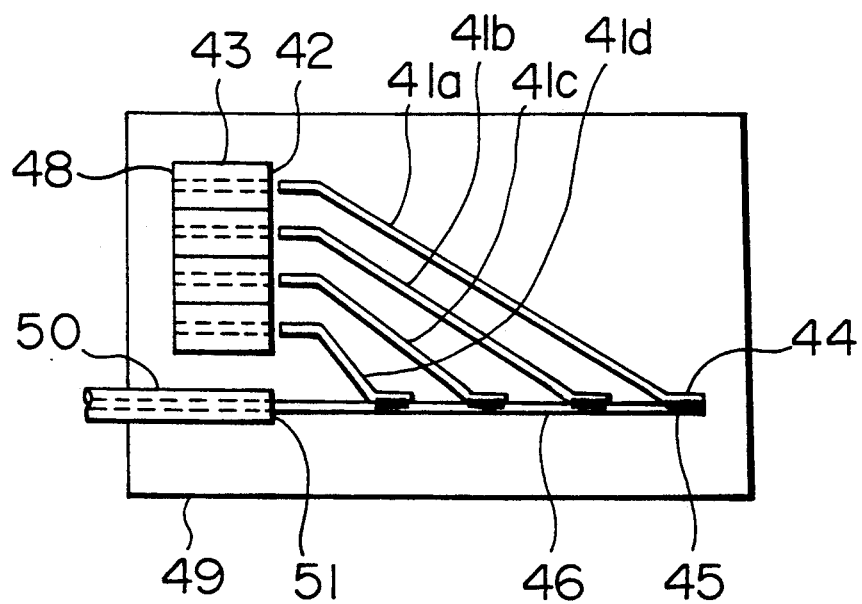
FIG. 5 is a schematic view showing a third prior art example of a multi-wavelength semiconductor laser.
Figure 6:
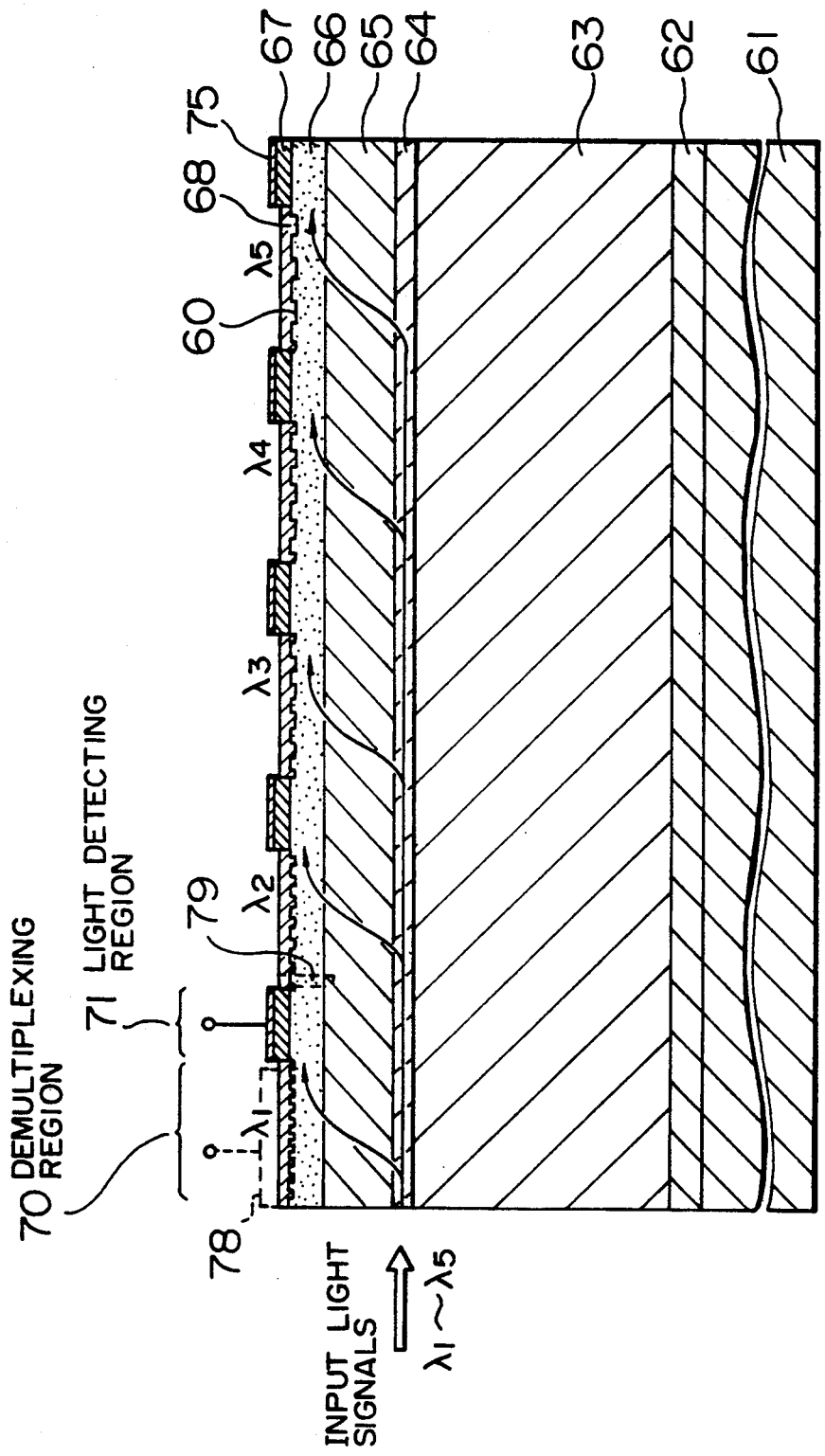
FIG. 6 is a sectional view illustrating a first embodiment of the present invention directed to a demultiplexing light detecting apparatus.

FIG. 6 shows a first embodiment of the present invention directed to a demultiplexing light detecting apparatus. In this demultiplexing light detecting apparatus, there are provided two waveguides 64 and 66 layered on a semiconductor substrate 61, and one of the waveguides 64 and 66 (in this case, the waveguide 66) has a grating 60 formed thereon. The two waveguides 64 and 66 respectively have different thicknesses and/or refractive indexes to form a so-called asymmetric directional coupler, and mode coupling is caused between the waveguides 64 and 66 by the grating 60 solely at a wavelength at which the compensation of a propagation constant occurs. That is, the coupling from the lower waveguide 64 to the upper waveguide 66 occurs to cause a light transfer to the upper waveguide 66 due to the grating 60 at the wavelength at which the coupling between the waveguides 64 and 66 is established, from lights of wavelengths $\lambda_1 \sim \lambda_5$ incident on and coupled to the lower waveguide 64.

Wavelength resolution is improved by a combination of the asymmetric directional coupler and the grating 60 formed in such a demultiplexing region 70, compared with a case where a mode dispersion is utilized between waveguides which form a simple directional coupler. Therefore, the multiplicity or the number of channels of signals in the wavelength division multiplexing system can be increased if the instant structure is used.

The light coupled to the upper waveguide 66 is absorbed by a light detecting layer 67 formed downstream of the grating 60 (i.e., in a light detecting region 71), and a signal detection is performed. Signal lights of the other wavelengths further advance along the lower waveguide 64 without being absorbed by the light detecting layer 67, and proceed to a next demultiplexing region 70. Thus, only light signals of predetermined wavelengths are coupled to the upper waveguide 66 and detected.

In this embodiment, a plurality of demultiplexing photodetectors each composed of the demultiplexing region 70 and the light detecting region 71 are serially connected along a light propagating direction in accordance with the wavelength multiplicity of input light signals. Pitches of gratings 60 in the respective demultiplexing regions 70 are different from one another depending on the wavelengths to be selected in the respective regions 70. Since the wavelength for which the propagation constant is compensated differs according to the grating pitch, light signals of different wavelength components can be simultaneously detected in the first embodiment.

The first embodiment is fabricated in the following manner. In FIG. 6, on the semi-insulating GaAs substrate 61, a undoped ($\phi$—) GaAs buffer layer 62 of 0.5 $\mu$m thickness, a $\phi$-$Al_{0.5}Ga_{0.5}As$ cladding layer 63 of 1.5 $\mu$m thickness, the lower waveguide 64 having a multiple quantum well (MQW) structure composed of plural periods of $\phi$.-GaAs (thickness: 30 Å) / $\phi$-$Al_{0.5}Ga_{0.5}As$ (thickness: 8.0 Å) and a total thickness of 0.08 $\mu$m, a $\phi$-$Al_{0.5}Ga_{0.5}As$ cladding layer 65 of 0.8 $\mu$m thickness, the upper waveguide 66 having a multiple quantum well (MQW) structure composed of plural periods of $\phi$-GaAs (thickness: 30 Å) / $\phi$-$Al_{0.4}Ga_{0.6}As$ (thickness: 60 Å) and a total thickness of 0.45 $\mu$m, and the n-GaAs light detecting layer 67 of 0.2 $\mu$m thickness (dopant concentration: $n=3\times10^{17}$ cm$^{-3}$) are grown in this order by a molecular beam epitaxy (MBE) method.

Figure 7:
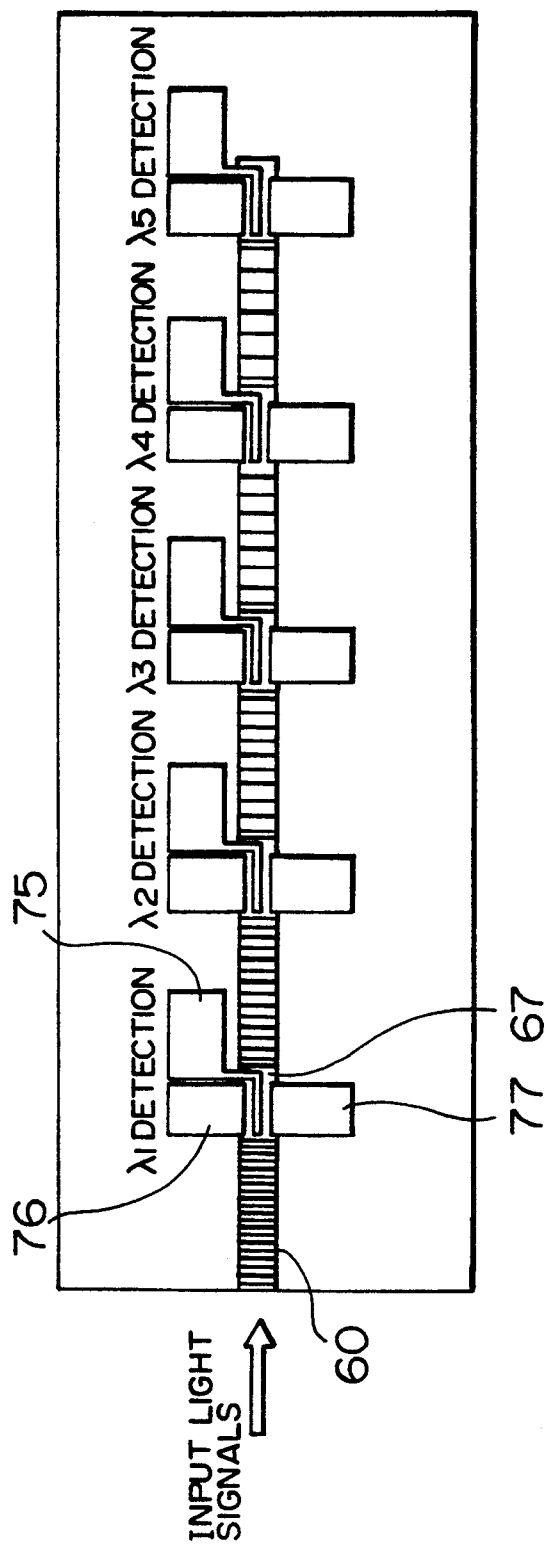
FIG. 7 is a plan view of the first embodiment of the present invention.

A patterning is conducted on the n-GaAs light detecting layer 67 by resist-patterning and dry-etching to form the MES-FET type light detecting region 71. Resist-patterning and reactive ion beam etching (RIBE) are then repeated to form ridge or rib type waveguides provided with the gratings 60 respectively having different pitches upstream of the respective light detecting regions 71, as shown in FIGS. 6 and 7. Next, after a cover layer 68 of $SiO_2$ for the waveguide 66 is layered, Au/Cr source and drain electrodes 76 and 77 are formed on the light detecting region 71 in such a manner to surround the waveguide 66, as shown in FIG. 7. Heat treatment is performed to obtain ohmic contants. Further, after an Al gate electrode 75 is formed between the source electrode 76 and the drain electrode 77, pick-up electrodes are respectively fabricated for gate, source and drain electrodes 75, 76 and 77. Thus, the MES-FET type light detecting region 71 is fabricated.

In this embodiment, five demultiplexing photodetectors are serially arranged, and grating pitches in the respective demultiplexing regions 70 are respectively 9 $\mu$m, 9.25 $\mu$m, 9.5 $\mu$m, 9.75 $\mu$m and 10 $\mu$m from the light signal input side. The depth of the respective gratings 60 is 0.1 $\mu$m, and the length thereof is 500 $\mu$m.

Figure 8:
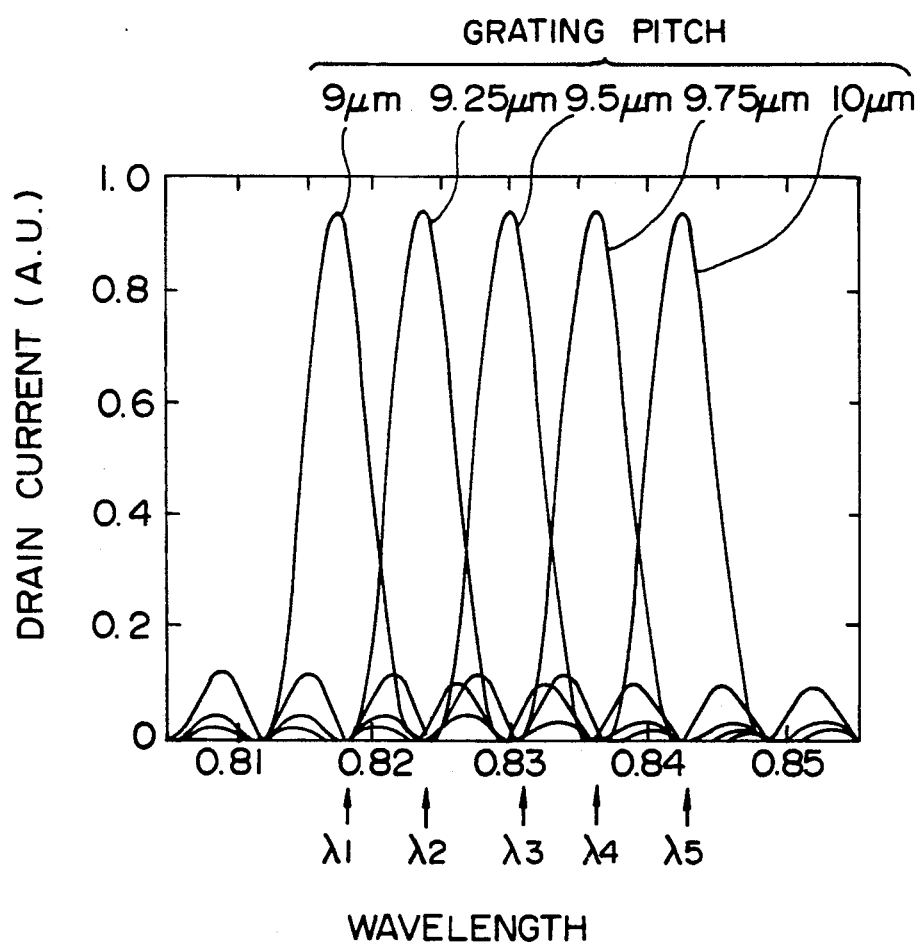
FIG. 8 is a graph representing a spectrum response of the first embodiment of the present invention.

In the first embodiment having the above structure, when a voltage of $-3$ V is applied to the respective gate electrodes 75, response characteristics as shown in FIG. 8 are obtained for input wavelengths from 0.805 $\mu$m to 0.855 $\mu$m. Numerals indicated at a top portion of FIG. 8 are respectively grating pitches, and the response characteristics of the photodetectors having these pitches in the respective demultiplexing regions 70 are illustrated. From FIG. 8, it is seen that a simultaneous detection of light signals having wavelengths $\lambda_1=0.817$ $\mu$m, $\lambda_2=0.824$ $\mu$m, $\lambda_3=0.83$ $\mu$m, $\lambda_4=0.836$ $\mu$m and $\lambda_5=0.842$ $\mu$m has been attained. The entire length of the device of the first embodiment amounts to 2.6 mm because five units respectively composed of the grating region 70 having the length of 500 $\mu$m and the light detecting region 71 having the length of 20 $\mu$m are serially arranged in the light propagating direction. To sum up, the simultaneous light detection of five wavelengths is possible in such a device whose light propagating entire length is merely 2.5 mm.

In the first embodiment, another electrode 78 may be formed on the demultiplexing region 70, as shown by dotted lines in FIG. 6, to change the wavelength to be demultiplexed at this region 70 by controlling a voltage applied thereto. This change is based on a change in an equivalent refractive index of the upper waveguide 66 due to plasma effect, quantum confined Stark effect (QCSE) or other effects.

Since a shorter wavelength is more likely to be absorbed than a longer wavelength, it is preferable to dispose regions for demultiplexing and detecting lights of shorter wavelengths at the light input side as far as possible. The first embodiment adopts such a structure.

Furthermore, in order to more completely prevent light of a wavelength demultiplexed at an upstream region from invading to a next light detecting region 71, a groove 79 having an appropriate depth extending in a direction of layered layers or a light absorbing region may be formed between adjacent demultiplexing and light detecting regions 70 and 71, as shown by dotted lines in FIG. 6. Moreover, a boundary surface between the adjacent regions may be formed diagonally to the light propagating direction to reflect light from an upstream upper waveguide 66 in a different direction from the light propagating direction.

In the first embodiment, the MES-FET photodetector is used, but that of other types may be used. In a second embodiment shown in FIG. 9, a pin type photodiode is used as a photodetector.

Figure 9:
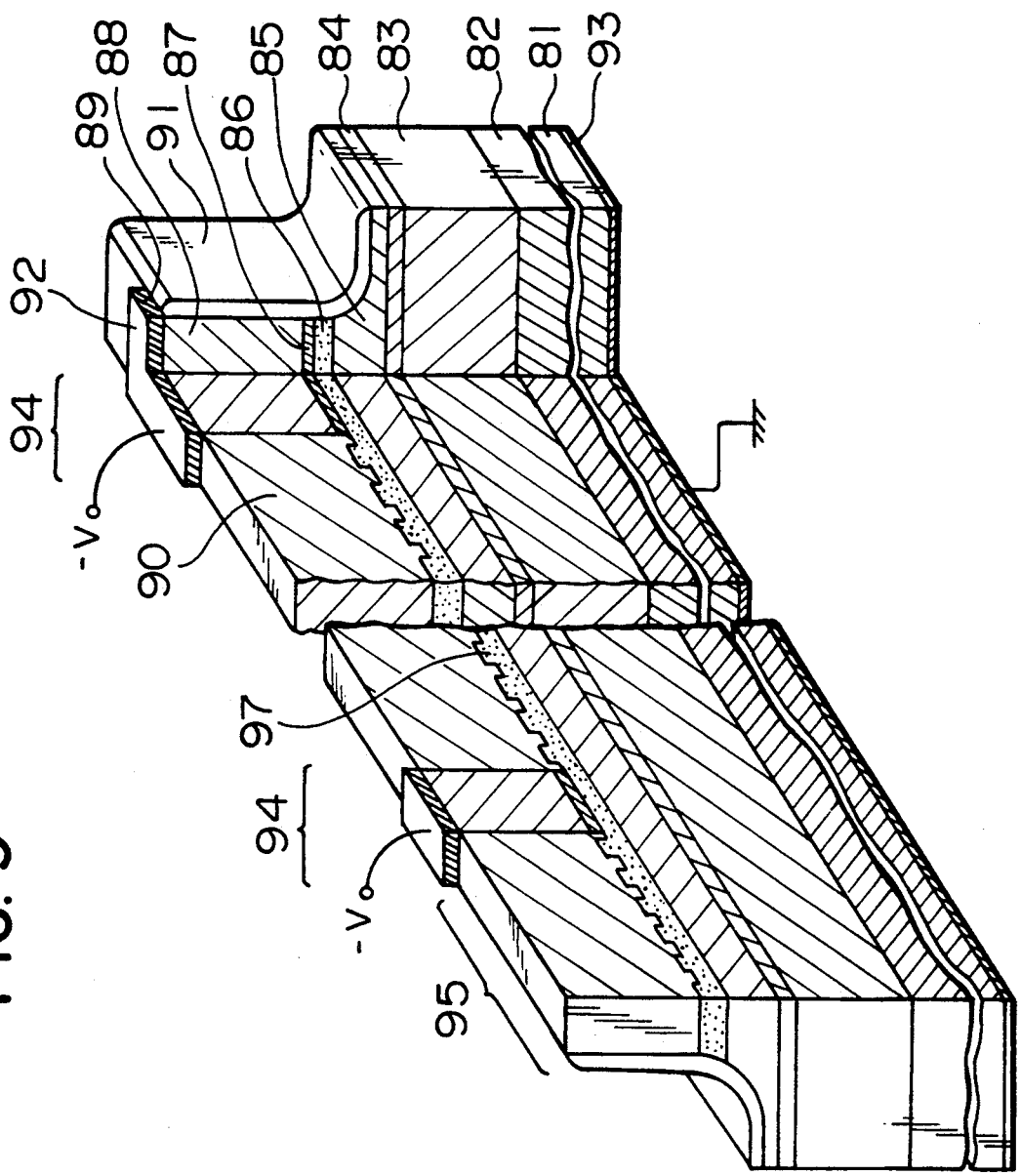
FIG. 9 is a partly broken perspective view of a second embodiment of the present invention directed to a demultiplexing light detecting apparatus.

The second embodiment shown in FIG. 9 is fabricated in the following manner. In FIG. 9, on an n$^+$-GaAs substrate 81, an n-GaAs buffer layer 82 of 0.5 $\mu$m thickness (dopant concentration: $n=2\times10^{18}$ cm$^{-3}$), n-$Al_{0.5}Ga_{0.5}As$ cladding layer 83 of 1.5 $\mu$m thickness (dopant concentration: $n=1\times10^{17}$ cm$^{-3}$), a lower waveguide 84 having an n-type multiple quantum well (n-MQW) structure composed of plural periods of GaAs (thickness: 30 Å)/$Al_{0.5}Ga_{0.5}As$ (thickness: 80 Å) and a total thickness of 0.08 $\mu$m (dopant concentration: $n=1\times10^{17}$ cm$^{-3}$), an intermediate n-$Al_{0.5}Ga_{0.5}As$ cladding layer 85 of 0.8 $\mu$m thickness (dopant concentration: $n=1\times10^{17}$ cm$^{-3}$), an n-$Al_{0.2}Ga_{0.8}As$ upper waveguide 86 of 0.25 $\mu$m thickness (dopant concentration: $n=1\times10^{17}$ cm$^{-3}$), an n-GaAs light detecting layer 87 of 0.05 $\mu$m thickness (dopant concentration: $n=5\times10^{15}$ cm$^{-3}$), a p-$Al_{0.5}Ga_{0.5}As$ cladding layer 88 of 1.5 $\mu$m thickness (dopant concentration: $p=1\times10^{18}$ cm$^{-3}$) and a p-GaAs contact layer 89 of 0.5 $\mu$m thickness (dopant concentration: $p=1\times10^{18}$ cm$^{-3}$) are grown in this order by the molecular beam epitaxy (MBE) method.

Next, only a light detecting region 94 is covered by photoresist, and the p-GaAs contact layer 89 is removed by an etchant of ammonia:hydrogen peroxide solution (1:200). Then, the p-$Al_{0.5}Ga_{0.5}As$ cladding layer 88 is removed by an etchant of hydrochloric acid:hydrogen peroxide solution (1:200), and thereafter the n-GaAs light detecting layer 87 is removed by an etchant of ammonia:hydrogen peroxide solution (1:200).

On the n-$Al_{0.2}Ga_{0.8}As$ upper waveguide 86 exposed by the above removal, a grating 97 is formed by the RIBE method, and a φ-Al$_{0.5}$Ga$_{0.5}$As layer 90 is selectively formed by a metal organic chemical vapor deposition (MOCVD) method. The depth of the grating 97 is 0.1 μm, and its pitch is set from 6 μm to 7.5 μm with an interval of 0.15 μm. Therefore, eleven demultiplexing photodetector units are serially arranged as a whole. The length of a grating region 95 is 400 μm, and that of the light detecting region 94 is 50 μm. Thus, the entire length of this device is about 5 mm.

Furthermore, in order to achieve a confinement in a lateral direction, a ridge structure of a width of 3 μm extending in the light propagating direction (i.e., a direction perpendicular to the grating 97) is formed by the RIBE method (i.e., the ridge structure is formed by etching to the intermediate cladding layer 85), and an insulating layer 91 of Si$_3$N$_4$ is grown on the ridge side surface except for the contact layer 89. On the contact layer 89 in the light detecting region 94, an AuCr/Au electrode 92 is then deposited, and an AuGe/Au electrode 93 is deposited on the bottom surface of the substrate 81 after this bottom surface is lapped. Finally, ohmic contacts of the electrodes 92 and 93 are achieved by a high-temperature treatment, and a wafer is chipped.

In the second embodiment having the above structure, a voltage of −5 V is applied to the respective light detecting regions 94 (pin photodiodes), and a light signal of 20 Mbps is input into the lower waveguide 84. The light signal is wavelength-division multiplexed, and has eleven channels with an interval of 3 nm from λ=820 nm to λ=850 nm. In the second embodiment, respective wavelength components are selected in the demultiplexing regions 95 having respective gratings 97, and the selected components are coupled to the upper waveguide 86 to be absorbed and detected in the respective light detecting layers 87. The eleven-channel light signals can be independently detected, and cross talk between the wavelengths is less than −20 dB. A minimum detectable light power level is −40 dBm at the input stage. Also in the second embodiment, modifications or changes similar to those of the first embodiment are possible.

In the demultiplexing light detecting apparatus according to the present invention, a plurality of units of directional coupler type demultiplexing regions respectively having gratings of different pitches and light detecting regions are serially arranged in the light propagating direction such that the wavelength-division multiplexed light signals and the like may be simultaneously detected.

The directional coupler type demultiplexing device in which the optical coupling between the waveguides are performed with the aid of the grating is used in each demultiplexing region, and hence the wavelength resolution is enhanced. As a result, the wavelength multiplicity can be made large, i.e., the number of signal channels can be increased, and therefore, a high density optical communication can be attained. Furthermore, a voltage is applied in the light detecting region independently from the demultiplexing region, and hence the light detecting performance of each unit can be unified. Moreover, the demultiplexing light detecting apparatus of this invention only needs to have a light propagation length of several mm for simultaneously detecting signals of wavelengths from several to several tens, and this photodetector is thus compact in size and is suitable for integration with other devices.

Figure 12:
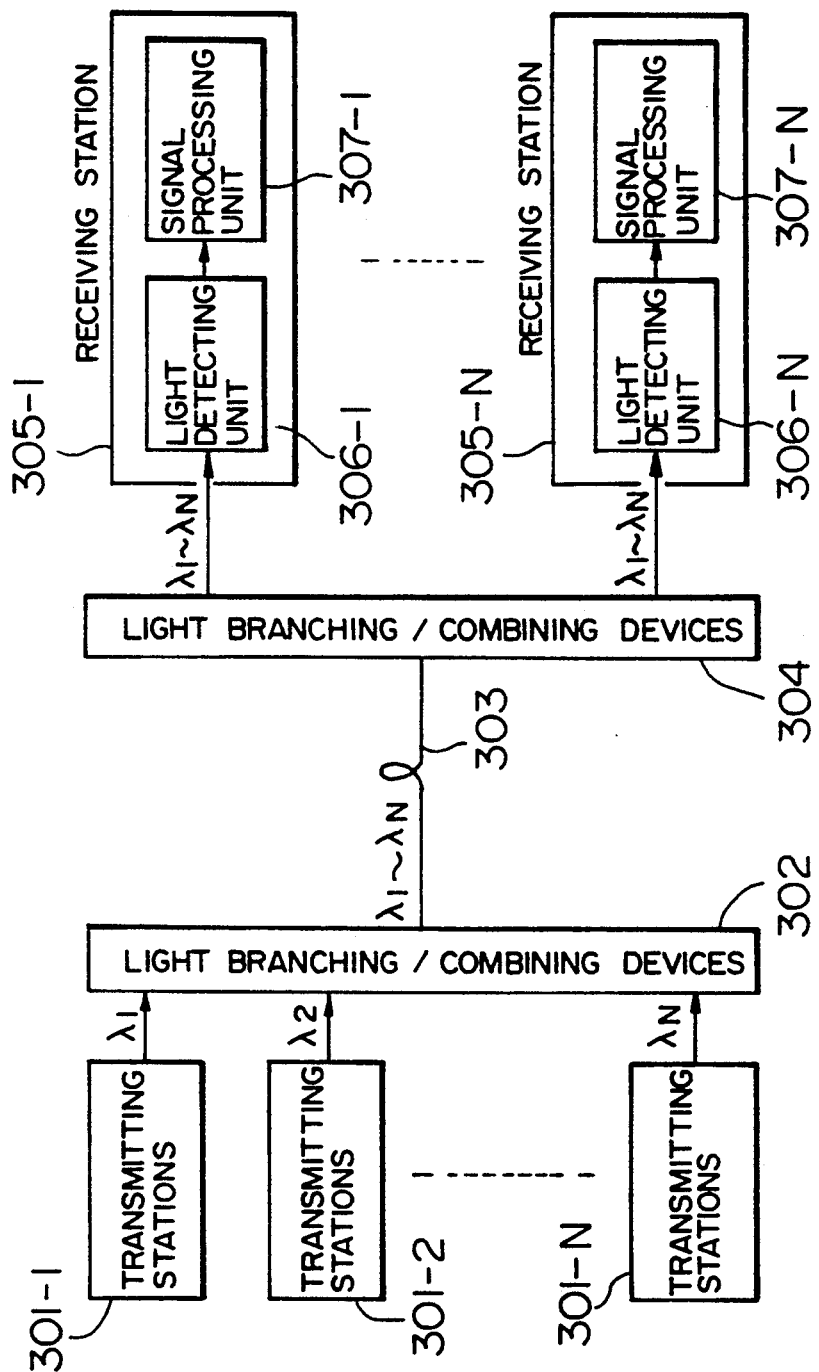
FIG. 12 is a block diagram of an N×N wavelength multiplex optical communication system employing multi-wavelength light detecting apparatus in accordance with the present invention.

FIG. 12 is a block diagram of an N×N wavelength multiplex optical communication system employing multi-wavelength light detecting apparatus in accordance with the present invention. Referring to this Figure, the N×N wavelength multiplex optical communication system includes transmitting stations 301-1, 301-2, ... and 301-N, light-branching/combining devices 302 and 304, an optical transmission path 303 such as an optical fiber path, and receiving stations 305-1, 305-2, ... and 305-N. Each receiving station includes light detecting units 306-1, 306-2, ... and 306-N and signal processing units 307-1, 307-2, ... and 307-N. Each of the light detecting units 306-1, 306-2 ... and 306-N includes a multi-wavelength light detecting apparatus which may either be of the type of the first embodiment or the second embodiment described above.

The transmitting stations 301-1, 301-2, ... , 302-N emit light signals of different wavelengths λ$_1$, λ$_2$, ... and λ$_N$. These light signals are superposed by the light-branching/combining device 302 to form a superposed signal which is then transmitted to the light-branching/combining device 304 via the optical transmission path 303. The light-branching/combining device 304 operates to branch off the light signals of wavelengths λ$_1$, λ$_2$, ... and λ$_N$ from the superposed signal and directs these light signals to receiving stations 305-1, 305-2, ... and 305-N. Each receiving station selectively receives the light signal of a desired wavelength by the operation of the light detecting units independently of other receiving stations. Thus, the described system permits multi-window access. Two-way transmission is possible provided that each of the transmitting stations 301-1, 301-2, ... and 301-N has a receiving function and that each of the receiving stations 305-1, 305-2, ... and 305-N has a transmitting function.

Figure 10:
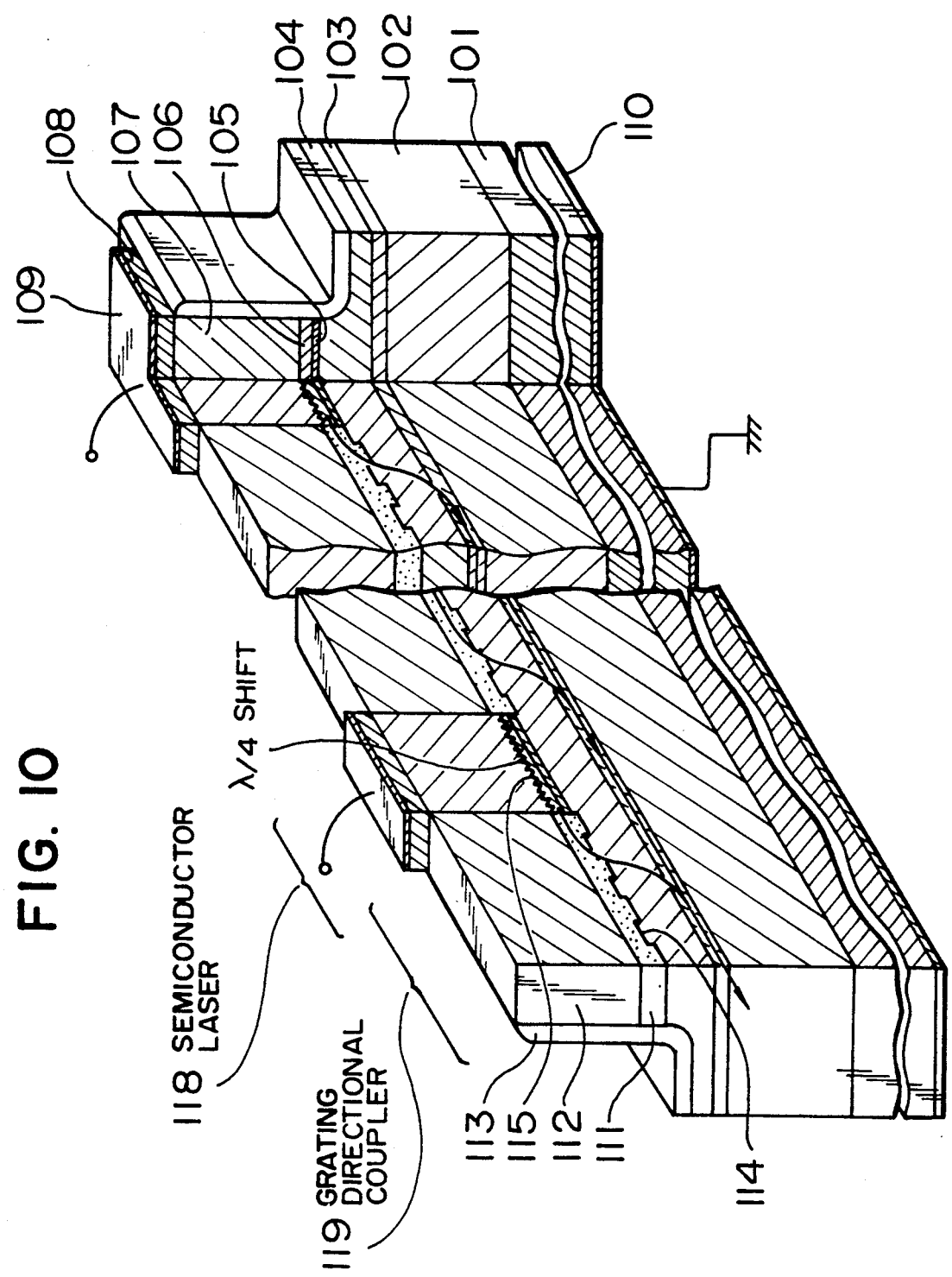
FIG. 10 is a partly broken perspective view of a third embodiment of the present invention directed to a multi-wavelength light emitting apparatus.

FIG. 10 shows a basic structure of a third embodiment of the present invention directed to a multi-wavelength light emitting apparatus. In this multi-wavelength light emitting apparatus, there are provided a plurality of units of semiconductor lasers having different oscillation wavelengths and directional grating couplers for causing an optical coupling between waveguides in accordance with respective oscillation wavelengths serially arranged in the light propagating direction. The semiconductor is preferably a distributed feedback (DFB) or distributed Bragg reflection (DBR) type laser which is suitable for integration, but other types of lasers may be used. In this embodiment, a semiconductor laser 118 is the DFB type, and has a grating of a pitch Λ$_{LD, i}$ in accordance with an oscillation wavelength λ$_i$. The pitch Λ$_{LD, i}$ is represented by:

$$\Lambda_{LD, i} = m \cdot \lambda_i / 2 n_{eff} (m = 1, 2, 3, ...) \quad (1)$$

where n$_{eff}$ is the effective refractive index of an oscillation mode. This relation holds true in a case of the DBR type.

In this embodiment, there is provided a common waveguide 103 at a certain distance from an active layer 105 of the semiconductor laser 118. In a grating directional coupler 119, an upper waveguide 111 is formed in accord with the active layer 105 of the semiconductor laser 118, and the common waveguide 103 is also formed in accord with the waveguide 103 in the semiconductor laser 118. A grating 114 for wavelength selection coupling is formed in a coupling region between the upper waveguide 111 and the common waveguide 103.

The two waveguides of the grating directional coupler 119, namely, the upper waveguide 111 and the common waveguide 103 have different thicknesses and/or refractive indexes to form a so-called asymmetric directional coupler, and mode coupling is caused between the waveguides 111 and 103 by the grating 114 solely at a wavelength at which the compensation of a propagation constant occurs. That is, the coupling from the upper waveguide 111 to the common waveguide 103 occurs to cause a light transfer to the common waveguide 103, due to the grating 114 at a wavelength at which the mode matching is established, from lights radiated by the semiconductor lasers 118 and propagating along the upper waveguide 111. Here, a pitch $\Lambda_{g, i}$ of the grating 114 is represented by:

$$\Lambda_{g, i} = \lambda_i / |n_{up, i} - n_{com, i}| \qquad (2)$$

where $\lambda_i$ is the oscillation wavelength of the semiconductor laser 118, $n_{up, i}$ is the effective refractive index of a mode propagating through the upper waveguide 111 and $n_{com, i}$ is the effective refractive index of a mode propagating through the common waveguide 103. The minus sign (−) at the right side indicates a forward direction coupling.

Thus, in the coupling due to the directional coupler through the grating 114, a strong wavelength selection is caused near the Bragg condition represented by the equation (2). Therefore, a light transfer between the waveguides 111 and 103 occurs solely at a desired laser oscillation wavelength. Conversely speaking, the pitch $\Lambda_{g, i}$ of the grating 114 in the grating directional coupler 119 is set in accordance with the oscillation wavelength of the corresponding semiconductor laser 118 so as to cause such light transfer.

In this embodiment, there are provided a plurality of units of the semiconductor lasers 118 and the grating directional couplers 119 formed in accordance with the respective oscillation wavelengths of corresponding semiconductor lasers 118, and these units are serially arranged in the light propagating direction, corresponding to different wavelengths of the wavelength division multiplexing system. Namely, lights radiated from the respective semiconductor lasers 118 are guided to the common waveguide 103 by the respective grating couplers 119 and propagated through the common waveguide 103. Those propagating lights will not be coupled to downstream semiconductor lasers 118 and grating directional couplers 119 when propagating therethrough. Thus, those lights are emitted from a common emission end (in FIG. 10, the end surface at the left hand side.).

As explained above, in this embodiment, the grating pitch of the semiconductor laser 118 is set by the equation (1) in accordance with each radiation wavelength, and the grating pitch of the grating directional coupler 119 is set by the equation (2), so that the device is capable of being independently driven per each wavelength. As a result, wavelength division multiplexed light signals can be emitted from the common emission end.

The third embodiment is fabricated in the following manner. In FIG. 10, on an n+-GaAs substrate 101, an n-GaAs buffer layer (not shown) of 0.5 μm thickness (dopant concentration: $n = 2 \times 10^{18}$ cm$^{-3}$), an n-Al$_{0.5}$Ga$_{0.5}$As cladding layer 102 of 1.5 μm thickness (dopant concentration: $n = 1 \times 10^{17}$ cm$^{-3}$), the n-Al$_{0.3}$Ga$_{0.7}$As common waveguide 103 of 0.08 μm thickness (dopant concentration: $n = 1 \times 10^{17}$ cm$^{-3}$), an intermediate n-Al$_{0.5}$Ga$_{0.5}$As cladding layer 104 of 0.8 μm thickness (dopant concentration: $n = 1 \times 10^{17}$ cm$^{-3}$), the undoped (φ-) Al$_{0.07}$Ga$_{0.93}$As active layer 105 of 0.07 μm thickness and a p-Al$_{0.2}$Ga$_{0.8}$As guide layer 106 of 0.2 μm thickness are grown in this order by the MOCVD method.

Next, after a photoresist is coated, a two-beam interference pattern of a He-Cd laser having a pitch changed per the oscillation wavelength is exposed in a region in which each semiconductor laser 118 is to be formed and the development is conducted therein. The p-Al$_{0.2}$Ga$_{0.8}$As guide layer 106 is then etched by the RIBE, and a fine grating pattern 115, as shown in FIG. 10, is obtained after removal of the photoresist. The grating pattern 115 has a so-called λ/4 shift structure in its central portion in order to overcome the instability of the oscillation mode. The λ/4 shift structure can be easily obtained by such a method in which negative and positive photoresists are alternately coated (for example, see Japanese Patent Laid-Open No. 62-262004).

Next, after masking a portion to be the grating directional coupler 119 with SiO$_2$, a p-Al$_{0.5}$Ga$_{0.5}$As cladding layer 107 (dopant concentration: $p = 1 \times 10^{18}$ cm$^{-3}$) and a p+-GaAs contact layer 108 (dopant concentration: $p^+ = 2 \times 10^{18}$ cm$^{-3}$) are grown on the fine grating 115 by the MOCVD method. The DFB type semiconductor laser 118 is fabricated by the above process.

On the other hand, the grating directional coupler 119 is produced as follows. After the SiO$_2$ mask on its region is removed, a SiO$_2$ mask is in turn formed on the semiconductor laser 118. The p-Al$_{0.2}$Ga$_{0.8}$As guide layer 106 is removed by an etchant mixture of sulfuric acid:hydrogen peroxide solution:water, and the φ-Al$_{0.07}$Ga$_{0.93}$As active layer 105 is removed by etchant of ammonia:hydrogen peroxide solution. Then, after a photoresist is coated, this portion is exposed through a photomask in which the grating pitch is set in accordance with the position of the grating directional coupler 119 and the coupling wavelength, and is developed. The portion is etched by the RIBE, and the grating 114 as shown in FIG. 10 is obtained after the photomask is removed. In this embodiment, since the pitch of the grating 114 is relatively rough, the grating 114 can be obtained by such process.

On the grating 114, the φ-MQW upper waveguide 111 (well: GaAs of 30 Å thickness, and barrier: Al$_{0.4}$Ga$_{0.6}$As of 80 Å thickness) of 0.5 μm thickness and a φ-Al$_{0.5}$Ga$_{0.5}$As cladding layer 112 of 1.5 μm thickness are grown by the MOCVD method to fabricate the grating directional coupler 119.

Furthermore, after the SiO$_2$ mask on the semiconductor laser 118 is removed, a ridge structure of 3 μm width extending in a direction perpendicular to the gratings 114 and 115 (light propagating direction) as shown in FIG. 10, is formed by a photoresist and the RIBE method, and an Si$_3$N$_4$ layer 113 is embedded at both sides of the ridge. On the p+-contact layer 108 of the semiconductor laser 118, an Au-Cr/Au electrode 109 is deposited, and after the bottom of the substrate 101 is lapped, an Au-Ge/Au electrode 110 is deposited thereon. Finally, ohmic contacts of the electrodes 109 and 110 are achieved by a high-temperature treatment, and a wafer is chipped.

In the above structure, NRZ signals of 150 Mbps are input into the respective semiconductor lasers 118, and the wavelength division multiplexed signals are emitted from a common emission end. It is confirmed that respective light signals can be independently transmittable, by demultiplexing and detecting the thus emitted light signals.

The oscillation wavelengths $\lambda_i$, fine grating pitches $\Lambda_{LD,i}$ of the DFB type lasers 118 and grating pitches $\Lambda_{g,i}$ of the grating directional couplers 119 at respective stages are as follows:

|   | $\lambda_i$ (nm) | $\Lambda_{LD,i}$ (nm) | $\Lambda_{g,i}$ (nm) |
|---|---|---|---|
| 1) | 830 | 237 | 9.1 |
| 2) | 835 | 239 | 9.3 |
| 3) | 840 | 240 | 9.5 |
| 4) | 845 | 241 | 9.7 |
| 5) | 850 | 243 | 9.9 |

The depth of each grating directional coupler 119 is 0.1 μm, the grating region length is 400 μm, the depth of the fine grating 115 in each semiconductor laser 118 is 0.1 μm and its region length is 300 μm. Thus, a multi-wavelength light emitting apparatus consisting of five units has an entire length of 3.5 mm, and its width which corresponds to the electrode width is only about 100 μm.

Figure 13:
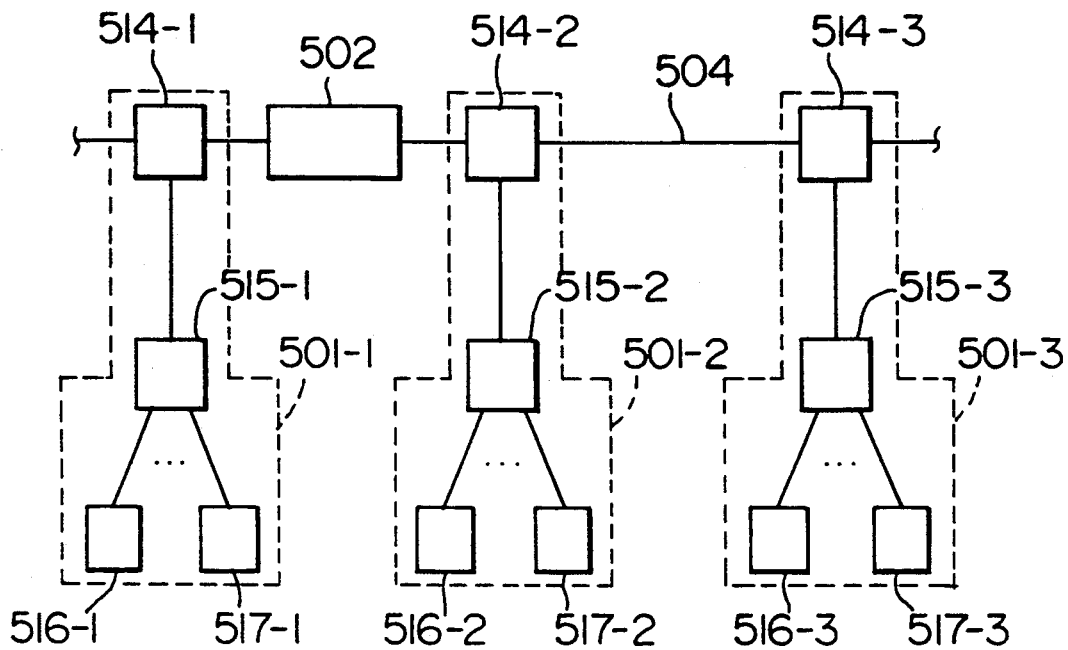
FIG. 13 is a block diagram of an optical bus type local area network (LAN) employing multi-wavelength light detecting apparatus and multi-wavelength emitting apparatus in accordance with the present invention.

FIG. 13 is a block diagram of an optical bus type local area network (LAN) employing multi-wavelength light detecting apparatus and multi-wavelength emitting apparatus in accordance with the present invention. Referring to this Figure, the LAN includes terminal devices 501-1, 501-2, 501-3, . . . , light-branching/combining devices 515-1, 515-2, 515-3, . . . , photo-couplers 514-1, 514-2, 514-3, . . . , an optical amplifier 502, laser units 516-1, 516-2, 516-3, . . . as light sources, light detecting units 517-1, 517-2, 517-3, . . . and a bus line such as an optical fiber bus. Each of the laser units 516-1, 516-2, 516-3 . . . includes a multi-wavelength light emitting apparatus of the third embodiment described above. Each of the light detecting units 517-1, 517-2, 517-3 . . . includes a multi-wavelength light detecting apparatus which may either be of the type of the first or second embodiment described above. The communication system may be of CSMA/CD token BUS or TDMA type.

For the purpose of transmitting a signal from, for example, the terminal device 501-1 to the terminal device 501-3, in the network shown in FIG. 13, the laser unit 516-1 transmits a communication demand signal in the form of a light of a wavelength $\lambda_1$. The communication demand signal is sent to the bus line 504 via the light-branching/combining device 515-1 and the photocoupler 514-1. In order to compensate for any loss, the communication demand signal is amplified by the optical amplifier 502 during transmission along the bus line 504. The photocoupler 514-3 of the terminal device 501-3 picks up the signal from the bus line 504 and sends it to the light detecting unit 517-3 via the light-branching/combining device 515-3. The light detecting unit 517-3 selectively receives the light signal of the wavelength $\lambda_1$ back to the terminal device 501-1 in a manner similar to the transmission of the demand signal. When the acknowledgment signal is received by the terminal device 501-1, the laser unit 516-1 of this terminal device 501-1 transmits signals such as data and image signals to the terminal device 501-3 by means of one or more lights of wavelengths $\lambda_2$, $\lambda_3$ . . . different from the above-mentioned wavelength $\lambda_1$.

In the third embodiment, the DFB type semiconductor laser is used, and the grating directional coupler utilizes a forward coupling. In a fourth embodiment explained below, a DBR type laser and a reverse coupling are used. Its fabrication process is substantially the same as that of the third embodiment.

Figure 11:
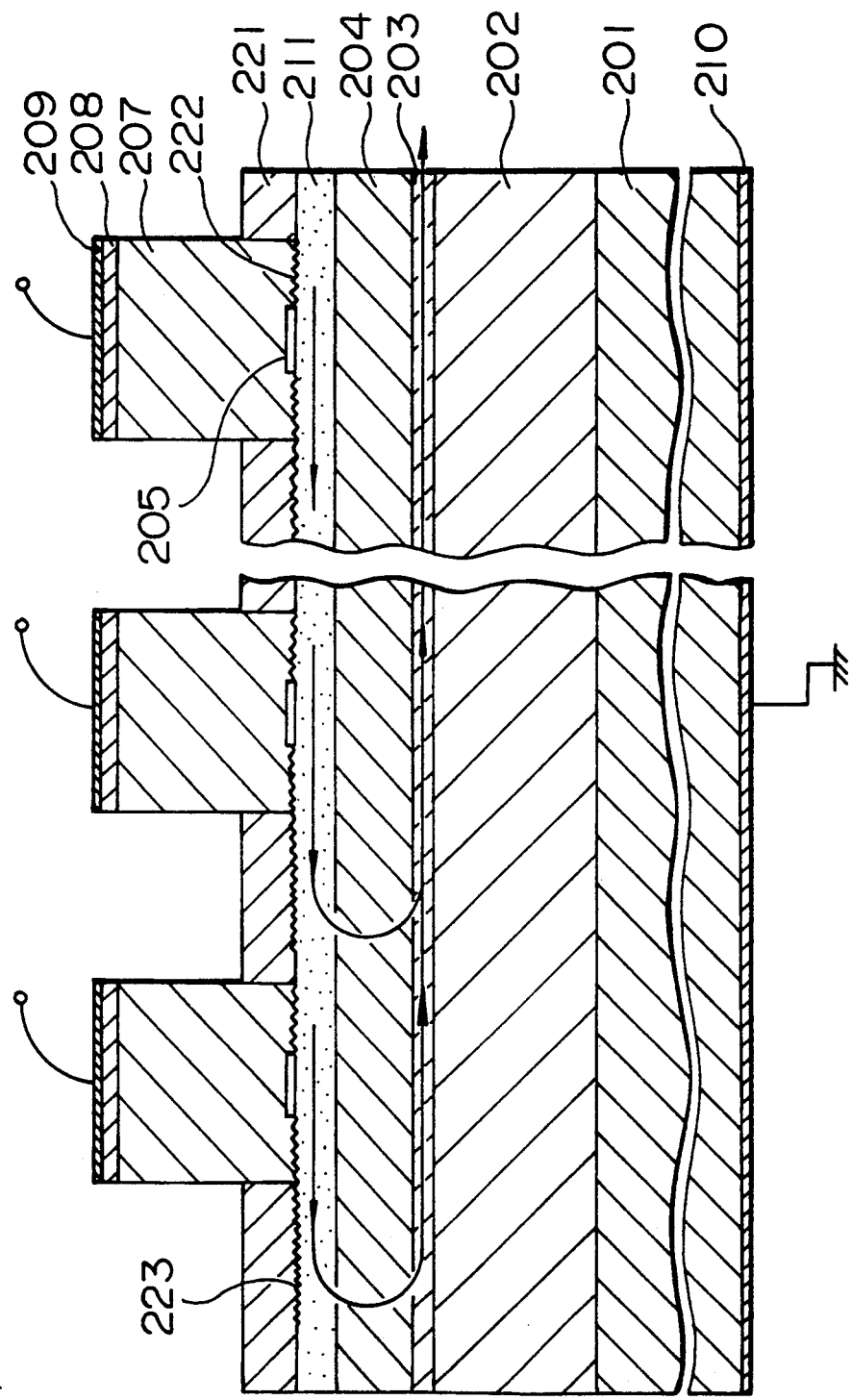
FIG. 11 is a sectional view of a fourth embodiment of the present invention directed to a multi-wavelength light emitting apparatus.

In a DBR type laser 218, as shown in FIG. 11, an active layer 205 is formed only in an active region interposed between gratings (DBR) 222. In a grating directional coupler 219, a cladding layer 221 of $Si_3N_4$ is formed on a grating 223. The grating 223 in the grating directional coupler 219 has a finer pitch than that of the third embodiment, and its pitch is determined by the following equation (3) instead of the equation (2).

$$\Lambda_{g,i} = M \cdot \lambda_i / |N_{up,i} + N_{com,i}| \quad (M=1,2,3,\ldots) \tag{3}$$

In the reverse coupling (the plus sign (+) at the right side indicates the reverse coupling), the oscillated light of the semiconductor laser 218 propagates through a common waveguide 203 in a reverse direction to the light propagating direction in an upper waveguide 211, when the oscillated light is guided into the common waveguide 203 by the grating directional coupler 219. Lights radiated from the respective semiconductor lasers 218 are guided to the common waveguide 203 by the respective grating couplers 219 and propagated through the common waveguide 203. Those propagating lights will not be coupled to downstream semiconductor lasers 218 and grating directional couplers 219 when propagating therethrough. Thus, those lights are emitted from a common emission end (in FIG. 11, the end surface at the right-hand side.). In the reverse coupling, the wavelength selectivity is sharper than that in the forward coupling, and therefore, intervals between radiated wavelengths of the semiconductor lasers 218 can be shortened. As a result, the wavelength multiplicity of the wavelength division multiplexing system can be increased.

When the grating 223 of the grating directional coupler 219 is fabricated in the fourth embodiment, a photomask cannot be used as in the third embodiment since its pitch is fine. Therefore, the grating 223 is formed by using a two-beam interference pattern of a He-Cd laser and then performing the exposure as in the case of the DBR type laser 218. Also in the fourth embodiment, NZR signals of 150 Mbps are input into the respective semiconductor lasers 218, and the wavelength division multiplexed signals are emitted from a common emission end (its multiplicity is ten). In this case, there are provided ten units of DBR type lasers 218 and grating directional couplers 219.

The length of the grating directional coupler 219 is 200 μm, and the length of the DBR type laser 218 is 400 μm. Therefore, a multi-wavelength light emitting apparatus consisting of ten units has an entire length of 6 mm. In FIG. 11, elements or portions having the same function as those in FIG. 10 are designated by corresponding numerals in two hundred.

In the fourth embodiment, the semiconductor laser 218 may be constructed as a tunable one in which its oscillation wavelength is changeable. In this case, the range of changeable wavelengths is relatively narrow, and hence the grating 223 in the grating directional coupler 219 can be used as it is. With respect to a tunable laser, see, for example. "Distributed Bragg Reflection Type LD (DBR LD) Having Phase Regulating Region And Bragg Wavelength Control Region" written in Electronics Letters, vol. 23, No. 3, pp. 403–405 (1987) and "Multi-Electrode Distributed Feedback LD (DFB LD)" written in the same journal, vol. 25, No. 15, pp. 990–992 (1989).

Figure 14:
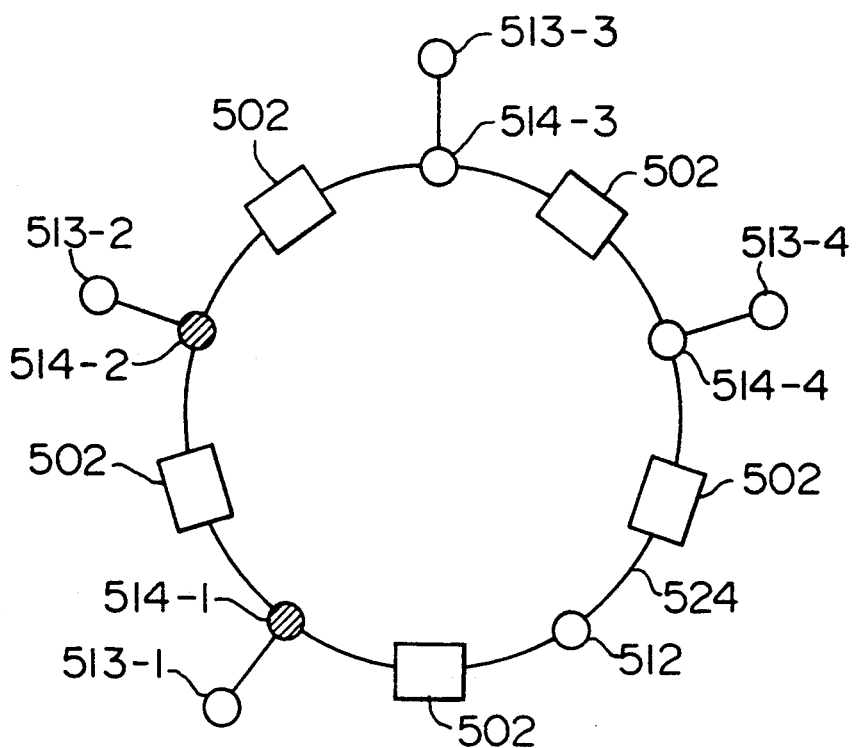
FIG. 14 is a block diagram of an optical loop type LAN employing a multi-wavelength detecting apparatus and multi-wavelength light emitting apparatus of the present invention.

FIG. 14 is a block diagram of an optical loop type LAN employing multi-wavelength detecting apparatus and multi-wavelength light emitting apparatus of the present invention. Referring to this Figure, the LAN includes terminal devices 513-1, 513-2, 513-3, . . . , a control station 512, photo-couplers 514-1, 514-2, 514-3, . . . , and optical amplifiers 502. Numeral 524 denotes a loop line such as an optical fiber line. The communication system is, for example, of a token ring type.

In this LAN, light signal from a terminal device can be received at a constant power level by virtue of the optical amplifier which is connected between each pair of adjacent photo-couplers and which serves as a booster amplifier. Each terminal device includes a multi-wavelength light emitting apparatus of the third embodiment and a multi-wavelength light detecting apparatus which may either be of the type of the first or second embodiment described before. With this arrangement, it is possible to conduct simultaneous transmission of a plurality of data signals, as well as control and access signals, by employing a plurality of light signals of different wavelengths.

In the multi-wavelength light emitting apparatus according to the present invention, a plurality of units of semiconductor lasers and grating directional couplers having gratings of different pitches are serially arranged in the light propagating direction in accordance with the wavelength multiplicity. As a result, for example, sub-wavelength division multiplexed light signals can be independently driven, and these signals can be transmitted from a common emission end.

The grating directional coupler for coupling the light radiated from the semiconductor laser to the common waveguide is serially connected directly to the corresponding semiconductor laser, and its coupling length is short. Therefore, the entire length of the multi-wavelength light emitting apparatus can be reduced and made compact in size, compared to a conventional case where an ordinary coupler is used. Thus, the device of the present invention is suitable for integration. Furthermore, since the grating directional coupler has a sharp wavelength selectivity near the Bragg condition, the interval between radiated wavelengths from the semiconductor lasers can be shortened. As a result, the wavelength multiplicity of the wavelength division multiplexing system can be increased, and the number of signal channels can be set to a large number.

While solely photodetectors or semiconductors lasers are provided together with grating directional couplers in the above-discussed embodiments, at least one photodetector and at least one semiconductor laser may be formed together with grating directional couplers for selectively or simultaneously performing light detecting and light emitting functions. The fabrication method therefor may be conducted by combining the above-mentioned fabricating processes.

While the present invention has been described with respect to what is presently considered to be the preferred embodiments, it is understood that the invention is not limited to the disclosed embodiments. The present invention is intended to cover various modifications and equivalent arrangements included within the spirit and scope of the appended claims.

What is claimed is:

1. A multi-wavelength light detecting and/or emitting apparatus comprising:

a first unit of a first directional coupler having a grating for an optical coupling function and a photodetector having a photoelectric conversion function, said first directional coupler and said photodetector being serially arranged in a light propagating direction; and a common light waveguide extending parallel with said first unit in the light propagating direction.

2. A multi-wavelength light detecting and/or emitting apparatus according to claim 1, further comprising a second unit of a second directional coupler having a grating for an optical coupling function and a semiconductor laser, said second directional coupler and said semiconductor laser being serially arranged in the light propagating direction and parallel with said common light waveguide.

3. A multi-wavelength light detecting and/or emitting apparatus according to claim 1, wherein there are provided a plurality of said first units and said gratings of said first directional couplers have different pitches from each other.

4. A multi-wavelength light detecting and/or emitting apparatus according to claim 2, wherein there are provided a plurality of said second units and said gratings of said second directional couplers have different pitches from each other.

5. A multi-wavelength light detecting and/or emitting apparatus according to claim 1, wherein said first directional coupler comprises two parallel waveguides and a cladding layer therebetween formed on a substrate.

6. A multi-wavelength light detecting and/or emitting apparatus according to claim 5, wherein said grating is formed on one of said two parallel waveguides.

7. A multi-wavelength light detecting and/or emitting apparatus according to claim 1, wherein said photodetector comprises a MES-FET type photodetector.

8. A multi-wavelength light detecting and/or emitting apparatus according to claim 1, wherein said photodetector comprises a pin photodetector.

9. A multi-wavelength light detecting and/or emitting apparatus according to claim 1, wherein said first directional couplers are arranged in an order from a shortest pitch of said grating thereof to a longest pitch of said grating thereof from a light input side.

10. A multi-wavelength light detecting and/or emitting apparatus according to claim 1, there are provided a plurality of said first units and wherein a groove is formed between said first units.

11. A multi-wavelength light detecting and/or emitting apparatus according to claim 1, there are provided a plurality of said first units and wherein a light absorbing region is formed between said first units.

12. A multi-wavelength light detecting and/or emitting apparatus according to claim 1, there are provided a plurality of said first units and wherein a boundary surface between said first units is formed diagonally to the light propagating direction.

13. A multi-wavelength light detecting and/or emitting apparatus according to claim 1, further comprising means for changing an effective pitch of said grating.

14. A multi-wavelength light detecting and/or emitting apparatus comprising:

a unit of a directional coupler having a grating for an optical coupling function and a semiconductor laser, said directional coupler and said semiconductor laser being serially arranged in a light propagating direction; and a common light waveguide extending parallel with said unit in the light propagating direction.

15. A multi-wavelength light detecting and/or emitting apparatus according to claim 14, wherein there are provided a plurality of said units and said gratings of said directional couplers have different pitches from each other.

16. A multi-wavelength light detecting and/or emitting apparatus according to claim 14, wherein said directional coupler comprises two parallel waveguides and a cladding layer therebetween formed on a substrate.

17. A multi-wavelength light detecting and/or emitting apparatus according to claim 14, wherein said grating is formed on one of said two parallel waveguides.

18. A multi-wavelength light detecting and/or emitting apparatus according to claim 14, wherein said semiconductor laser comprises a DFB type semiconductor laser.

19. A multi-wavelength light detecting and/or emitting apparatus according to claim 14, wherein said semiconductor laser comprises a DBR type semiconductor laser.

20. A multi-wavelength light detecting and/or emitting apparatus according to claim 14, wherein said grating has a forward direction coupling function.

21. A multi-wavelength light detecting and/or emitting apparatus according to claim 14, wherein said grating has a reverse direction coupling function.

22. A multi-wavelength light detecting and/or emitting apparatus according to claim 1, wherein said semiconductor laser comprises a tunable semiconductor laser.

23. An optical communication system comprising:
a plurality of transmitting stations;
a plurality of receiving stations, each of which comprise a light detecting apparatus comprising a first unit of a first directional coupler having a grating for an optical coupling function and a photodetector having a photoelectric conversion function, said first directional coupler and said photodetector being serially arranged in a light propagating direction, and a signal processing unit; and
a photoconductive transmitting route connecting said transmitting station and said receiving station.

24. An optical communication system comprising:
a plurality of terminal devices, each of which comprise a light detecting apparatus comprising a first unit of a first directional coupler having a grating for an optical coupling function and a photodetector having a photoelectric conversion function, said first directional coupler and said photodetector being serially arranged in a light propagating direction, and a plurality of laser units; and
an optical communication line connecting said plurality of terminal devices.

25. An optical communication system according to claim 24, wherein said optical communication line connects said plurality of terminal devices to a bus type.

26. An optical communication system according to claim 24, wherein said optical communication line connects said plurality of terminal devices to a loop type.

27. An optical communication system according to claim 24, further comprising:
an optical amplifier set up on the way of said optical communication line.

28. An optical communication system comprising:
a plurality of terminal devices, each of which comprise a light detecting apparatus and a laser unit comprising at least a unit of a directional coupler having a grating for an optical coupling function and a semiconductor laser, said directional coupler and said semiconductor laser being serially arranged in a light propagating direction, and a plurality of laser units; and
an optical communication line connecting said plurality of terminal units.

29. An optical communication system according to claim 28, wherein said optical communication line connects said plurality of terminal devices to a bus type.

30. An optical communication system according to claim 28, wherein said optical communication line connects said plurality of terminal devices to a loop type.

31. An optical communication system according to claim 28, further comprising:
an optical amplifier set up on the way of said optical communication line.

* * * * *

UNITED STATES PATENT AND TRADEMARK OFFICE
CERTIFICATE OF CORRECTION

PATENT NO. : 5,233,187
DATED : August 3, 1993
INVENTOR(S) : HAJIME SAKATA, et al.

It is certified that error appears in the above-indentified patent and that said Letters Patent is hereby corrected as shown below:

COVER PAGE

At [56], "2-4209 1/1990 Japan" should be deleted.
At [63], "Continuation" should read --Continuation-in-part--.

COLUMN 1

Line 14, "directioal" should read --directional--.
Line 26, "photodetector" should read --photodetectors--.
Line 48, "an" should read --the--; and "the" should read --an--.
Line 62, "p-AlGaAs" should read --p-AlGaAs--.

COLUMN 5

Line 22, "$\phi$.-GaAs" should read --$\phi$-GaAs--.
Line 45, "Al" should read --Al--.

COLUMN 8

Line 64, "waveguide 103" should read --waveguide 111--.

COLUMN 10

Line 33, "etchant" should read --an etchant mixture--.

COLUMN 12

Line 13, "$\Lambda_{g,i}=M\cdot\lambda_i/|N_{up,i}+N_{com,i}|$ ($M=1,2,3...$" should read --$\Lambda_{g,i}=M\cdot\lambda_i/|n_{up,i}+n_{com,i}|$ ($M=1,2,3...$)--.

UNITED STATES PATENT AND TRADEMARK OFFICE
CERTIFICATE OF CORRECTION

PATENT NO. : 5,233,187

DATED : August 3, 1993

INVENTOR(S) : HAJIME SAKATA, et al.

It is certified that error appears in the above-identified patent and that said Letters Patent is hereby corrected as shown below:

COLUMN 14

Line 47, "claim 1, there" should read --claim 1, wherein there--.
Line 51, "claim 1, there" should read --claim 1, wherein there--.
Line 55, "claim 1, there" should read --claim 1, wherein there--.

Signed and Sealed this

Nineteenth Day of July, 1994

BRUCE LEHMAN

*Attest:*

*Attesting Officer*       *Commissioner of Patents and Trademarks*